US008871424B2

(12) United States Patent
Merical et al.

(10) Patent No.: US 8,871,424 B2
(45) Date of Patent: Oct. 28, 2014

(54) LASER IMAGEABLE POLYOLEFIN FILM

(75) Inventors: Rick Merical, Duncan, SC (US); Russell Darley, Simpsonville, SC (US); Patrick R. Thomas, Duncan, SC (US)

(73) Assignee: Cryovac, Inc., Duncan, SC (US)

( * ) Notice: Subject to any disclaimer, the term of this patent is extended or adjusted under 35 U.S.C. 154(b) by 126 days.

(21) Appl. No.: 13/354,608

(22) Filed: Jan. 20, 2012

(65) Prior Publication Data

US 2013/0189617 A1 Jul. 25, 2013

(51) Int. Cl.

| | |
|---|---|
| ***G03F 1/00*** | (2012.01) |
| ***G03F 7/00*** | (2006.01) |
| ***B41M 5/20*** | (2006.01) |
| ***C04B 14/00*** | (2006.01) |

(52) U.S. Cl.
USPC ......... 430/270.1; 430/7; 430/945; 428/195.1; 503/200; 503/201; 106/400

(58) Field of Classification Search
USPC ......... 430/7, 945, 19, 905; 106/400; 503/200, 503/201
See application file for complete search history.

(56) References Cited

U.S. PATENT DOCUMENTS

| | | | | |
|---|---|---|---|---|
| 7,270,919 | B2 * | 9/2007 | Stubbs | 430/17 |
| 7,485,403 | B2 * | 2/2009 | Khan | 430/270.1 |
| 7,829,258 | B2 * | 11/2010 | Ukpabi | 430/270.1 |
| 7,887,667 | B2 | 2/2011 | Dolsey | |
| 8,021,820 | B2 * | 9/2011 | O'Donoghue et al. | 430/270.1 |
| 8,434,112 | B2 * | 4/2013 | Lee et al. | 725/50 |
| 2007/0074278 | A1 * | 3/2007 | Karst et al. | 726/5 |
| 2008/0026319 | A1 * | 1/2008 | Stroh et al. | 430/270.1 |
| 2009/0186758 | A1 | 7/2009 | Ukpabi | |
| 2009/0191420 | A1 * | 7/2009 | O'Donoghue et al. | 428/523 |
| 2009/0280250 | A1 | 11/2009 | Dolsey | |
| 2009/0289236 | A1 * | 11/2009 | Destro et al. | 252/586 |
| 2010/0015558 | A1 * | 1/2010 | Jarvis et al. | 430/346 |
| 2011/0094662 | A1 | 4/2011 | Dolsey | |
| 2011/0117335 | A1 | 5/2011 | Klein et al. | |

FOREIGN PATENT DOCUMENTS

| | | | |
|---|---|---|---|
| EP | 1767377 | A1 | 3/2007 |
| WO | 2007063332 | A2 | 6/2007 |
| WO | 2008050153 | A1 | 5/2008 |

* cited by examiner

*Primary Examiner* — Amanda C. Walke

(74) *Attorney, Agent, or Firm* — Ashley D. Wilson

(57) ABSTRACT

The presently disclosed subject matter is directed generally to a polymeric film that comprises at least one laser imageable marking layer. The marking layer comprises a polyolefin, a photochromatic pigment, and an additive. It has been surprisingly discovered that a polyolefin film comprising a marking layer formulated with a photochromatic pigment and an additive offers a substantial advantage over prior art methods of laser imaging polyolefin films.

22 Claims, No Drawings

LASER IMAGEABLE POLYOLEFIN FILM

FIELD OF THE INVENTION

The presently disclosed subject matter relates generally to polymeric films that can be laser imaged with text, symbols, and/or images. More specifically, the disclosed film comprises at least one marking layer that includes a polyolefin, a photochromatic pigment, and an additive.

BACKGROUND

The identification marking of products is becoming increasingly important in almost every branch of industry. For example, it is often necessary to apply marks such as production dates, expiration dates, bar codes, company logos, serial numbers, images, and the like. Most of these markings are currently executed using conventional techniques, such as printing or labeling. However, contactless and rapid marking with lasers is gaining growing importance, especially for plastics. The use of lasers permits the high-speed application of graphics, bar codes, and the like without any additional pre-treatment of the plastic to improve adhesion. In addition, laser marked images are durable and abrasion-resistant, since they are within the body of the plastic film.

Previously, many plastics have proven to be very difficult or even impossible to mark through the use of lasers. These include many common polyolefins, such as polyethylene, polypropylene, ethylene vinyl acetate, polybutene, and polyisoprene. Particularly, laser irradiation of polyolefins, even at very high power, produces a weak, virtually illegible mark since the absorption coefficient is not sufficiently high to induce a color change.

In addition, when lasers are used to mark a polyolefin film, the pigment can overheat in the direct vicinity of the irradiation site and distort or decompose the plastic. As a result, the plastic layer scatters the light and reduces the contrast of the mark. Specifically, the definition of the image becomes distorted or irregular, thereby rendering the mark commercially less effective or completely useless.

Thus, the industry is in need of a marking solution that allows for a smaller unit of production with customized information that can be included on individual packages. Graphics changes with traditional printing methods have proven to be expensive and require longer lead times due to the printing plates and the generation of negatives. It is often difficult to achieve smaller order lots with traditional printing methods, such as flexography or rotogravure. The use of laser marking therefore potentially allows for economical methods of converting and allows the end user to reduce waste from aged or obsolete inventory and/or frequent change orders. The medical applications field and regulation are also beginning to require specific unit track and trace, which would follow the on-demand marking solution noted in the presently disclosed subject matter.

The disclosed film provides a laser-imageable film comprising at least one polyolefin that provides high-contrast and good laser marking while simultaneously retaining the smooth, non-distorted surface of the polymer film.

SUMMARY

In some embodiments, the presently disclosed subject matter is directed to a polymeric film comprising a marking layer. Particularly, the marking layer comprises a polyolefin, a photochromatic pigment, and an additive. The disclosed film can be marked by a laser in a wavelength range from about 300 to 10,000 nm.

In some embodiments, the presently disclosed subject matter is directed to a method of laser marking a polymeric film. The method comprises providing a polymeric film comprising a marking layer. Particularly, the marking layer comprises a polyolefin, a photochromatic pigment, and an additive. The method further comprises exposing the film to a laser to produce an image on the film.

In some embodiments, the presently disclosed subject matter is directed to a method of making a package. The method comprises providing a polymeric film comprising a marking layer. The marking layer comprises a polyolefin, a photochromatic pigment, and an additive. The method further comprises sealing the multilayer film upon itself or to another film to form an enclosed package for a product. The polymeric film can be marked by a laser in a wavelength range from about 300 to 10,000 nm.

DETAILED DESCRIPTION

I. General Considerations

The presently disclosed subject matter is directed generally to a polymeric film that comprises at least one laser imageable marking layer. The marking layer comprises a polyolefin, a photochromatic pigment, and an additive. It has been surprisingly discovered that a polyolefin film comprising a marking layer formulated with a photochromatic pigment and an additive offers a substantial advantage over prior art methods of laser imaging polyolefin films.

II. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long standing patent law convention, the terms “a”, “an”, and “the” refer to “one or more” when used in the subject application, including the claims. Thus, for example, reference to “a film” includes a plurality of such films, and so forth.

Unless indicated otherwise, all numbers expressing quantities of components, reaction conditions, and so forth used in the specification and claims are to be understood as being modified in all instances by the term “about.” Accordingly, unless indicated to the contrary, the numerical parameters set forth in the instant specification and attached claims are approximations that can vary depending upon the desired properties sought to be obtained by the presently disclosed subject matter.

As used herein, the term “about”, when referring to a value or to an amount of mass, weight, time, volume, concentration, percentage, and the like can encompass variations of, and in some embodiments, ±20%, in some embodiments ±10%, in some embodiments ±5%, in some embodiments ±1%, in some embodiments ±0.5%, and in some embodiments ±0.1%, from the specified amount, as such variations are appropriated in the disclosed package and methods.

The term “abuse layer” as used herein refers to an outer film layer and/or an inner film layer, so long as the film layer serves to resist abrasion, puncture, and other potential causes of reduction of package integrity, as well as potential causes of reduction of package appearance quality. Abuse layers can comprise any polymer so long as the polymer contributes to achieving an integrity goal and/or an appearance goal.

As used herein, the term "adjacent", as applied to film layers, refers to the positioning of two layers of the film either in contact with one another without any intervening layer or with a tie layer, adhesive, or other layer therebetween. The term "directly adjacent" refers to adjacent layers that are in contact with another layer without any tie layer, adhesive, or other layer therebetween.

As used herein, the terms "barrier" and "barrier layer" as applied to films and/or film layers, refer to the ability of a film or film layer to serve as a barrier to gases and/or odors. Examples of polymeric materials with low oxygen transmission rates useful in such a layer can include: ethylene/vinyl alcohol copolymer (EVOH), polyvinylidene dichloride (PVDC), vinylidene chloride copolymer such as vinylidene chloride/methyl acrylate copolymer, vinylidene chloride/vinyl chloride copolymer, polyimide, polyester, polyacrylonitrile (available as Barex™ resin), or blends thereof. Oxygen barrier materials can further comprise high aspect ratio fillers that create a tortuous path for permeation (e.g., nanocomposites). Oxygen barrier properties can be further enhanced by the incorporation of an oxygen scavenger, such as an organic oxygen scavenger. In some embodiments, metal foil, metallized substrates (e.g., metallized polyethylene terephthalate ((PET)), metallized polyamide, and/or metallized polypropylene), and/or coatings comprising SiOx or AlOx compounds can be used to provide low oxygen transmission to a package. In some embodiments, a barrier layer can have a gas (e.g., oxygen) permeability of less than or equal to about 500 cc/m$^2$/24 hrs/atm at 73° F., in some embodiments less than about 100 cc/m$^2$/24 hrs/atm at 73° F., in some embodiments less than about 50 cc/m$^2$/24 hrs/atm at 73° F., and in some embodiments less than about 25 cc/m$^2$/24 hrs/atm at 73° F.

The term "bulk layer" as used herein refers to a layer used to increase the abuse-resistance, toughness, modulus, etc., of a film. In some embodiments, the bulk layer can comprise polyolefin (including but not limited to) at least one member selected from the group comprising ethylene/alpha-olefin copolymer, ethylene/alpha-olefin copolymer plastomer, low density polyethylene, and/or linear low density polyethylene and polyethylene vinyl acetate copolymers.

The term "coating" as used herein refers to a substantially continuous outer layer of film or material to a substrate (such as a film). See, for example, U.S. Patent Application Publication No. 2008/0085318 and U.S. Pat. Nos. 7,829,258; 4,245,003; and 4,886,704, the entire contents of which are hereby incorporated by reference.

As used herein, the term "film" can be used in a generic sense to include plastic web, regardless of whether it is film or sheet. The term "film" can include embodiments wherein the film is a laminate, such as wherein a film comprising a marking layer is adhesively laminated to a transparent film layer (such as 48 gauge PET, for example).

The term "high density polyethylene" refers an ethylene homopolymer or copolymer with a density of 0.940 g/cc or higher.

The term "laser" as used herein refers generally to a category of optical devices that emit a spatially and temporally coherent beam of light otherwise known as a laser beam. In some embodiments, the term "laser" refers to conventional lasers (such as $CO_2$, YAG, and fiber lasers), as well as laser diodes. See, for example, the subject matter disclosed in U.S. Pat. Nos. 6,124,425; 7,193,771; 6,108,025; 6,064,416; and U.S. Patent Application Publication No. 2008/0164650, the entire content of which is incorporated by reference herein.

The term "lidding film" refers generally to the film applied over a tray or bottom film to seal a tray or package. See, for example, U.S. Pat. Nos. 6,814,913; 6,602,590; and 6,503,549, the entire contents of which are incorporated by reference herein.

The term "linear low density polyethylene" or "LLDPE" as used herein refers to a polymer that comprises from about 1 to about 20 weight percent (in some embodiments about 1 to 10 weight percent) of higher alpha olefin monomer copolymerized therein. In some embodiments, the alpha olefin monomer employed in the ethylenic copolymer can be selected from the group comprising: 1-butene, 3-methyl-1-butene, 3-methyl-1-pentene, 1-hexene, 4-methyl-1-pentene, 3-methyl-1-hexene, 1-octene and 1-decene. The LLDPE resins that used in the presently disclosed subject matter can have densities ranging from about 890 to about 940 kg/m$^3$ (in some embodiments, from about 900 to about 930 kg/m3) and a melt index of from about 1 to about 10 g/10 minute, as determined by ASTM D-1238.

The term "low density polyethylene" or "LDPE" as used herein refers to an ethylenic polymer having a specific gravity of from about 910 to about 925 kg/m$^3$. High density polyethylene ("HDPE") has a specific gravity of from about 940 to about 970 kg/m$^3$. Medium density polyethylene ("MDPE") is generally defined as an ethylenic polymer having a specific gravity between the LDPE and the HDPE (i.e., from about 925 to about 940 kg/m$^3$). The term LDPE as used herein also includes physical blends of two or more different homopolymers that are classified as LDPEs. Similarly, the term MDPE and HDPE can also include blends of two or more different homopolymers classified as MDPEs and HDPEs, respectively.

The term "marking layer" as used herein refers to the layer of a film that is marked or imaged by a laser. In some embodiments, the marking layer can be the skin layer of a film. Alternatively, the marking layer can be an inner film layer, such as in embodiments wherein the film includes a transparent coating layered over the marking layer.

The term "metallocene-catalyzed polyethylene" or "mLLDPE" as used herein refers to a polymer having a low polydispersity. The low polydispersity polymer can be prepared from a partially crystalline polyethylene resin that is a polymer prepared with ethylene and at least one alpha olefin monomer, e.g., a copolymer or terpolymer. The alpha olefin monomer can in some embodiments have from about 3 to about 12 carbon atoms; in some embodiments, from about 4 to about 10 carbon atoms; and in some embodiments, from about 6 to about 8 carbon atoms. Exemplary comonomers can include (but are not limited to) propylene, 1-butene, 1-pentene, 1-hexene, 3-methyl-1-pentene, 4-methyl-1-pentene, 1-octene, 1-decene, and 1-dodecene.

The term "optical density" as used herein refers to a unitless value for the vibrancy of a printed image on a substrate. In some embodiments, the optical density refers to a gradation in gray levels between about 0.0 (fully transparent, fully reflective) to about 1.0 (black). Alternatively, in some embodiments, the practical minimum for a white paper can be about 0.0 and the practical maximum for black can be about 1.25 to 1.30.

As used herein, the term "peelable" refers to the capacity of a sealed lid or film to separate and release from sealed engagement with its underlying container while each substantially retains its integrity. Such separation and release can in some embodiments be achieved by a separating force applied manually to an outer edge portion of the sealed container.

The term "pigment" as used herein refers collectively to all colorant particles known in the art. In some embodiments, the pigment can be an insoluble, organic, or inorganic colorant.

The term "photochromatic" as used herein refers to the capability of darkening or changing color when exposed to light.

As used herein, the term "polymer" refers to the product of a polymerization reaction, and can be inclusive of homopolymers, copolymers, terpolymers, etc. In some embodiments, the layers of a film can consist essentially of a single polymer, or can have additional polymer together therewith, i.e., blended therewith.

As used herein, the term "polyolefin" refers to any polymerized olefin, which can be linear, branched, cyclic, aliphatic, aromatic, substituted, or unsubstituted. More specifically, included in the term polyolefin are homopolymers of olefin, copolymers of olefin, co-polymers of an olefin and a non-olefinic comonomer co-polymerizable with the olefin, such as vinyl monomers, modified polymers thereof, and the like. Specific examples include polyethylene homopolymer, polypropylene homopolymer, polybutene home-polymer, ethylene alpha-olefin copolymer, propylene alpha-olefin copolymer, butene alpha-olefin copolymer, ethylene unsaturated ester copolymer, ethylene unsaturated acid co polymer, (e.g., ethylene ethyl acrylate copolymer, ethylene butyl acrylate copolymer, ethylene methyl acrylate copolymer, ethylene acrylic acid copolymer, and ethylene methacrylic acid copolymer), ethylene vinyl acetate copolymer, ionomer resin, polymethylpentene, etc.

As used herein, the phrases "seal layer", "sealing layer", "heat seal layer", and "sealant layer", refer to an outer film layer, or layers, involved in the sealing of the film to itself, another film layer of the same or another film, and/or another article that is not a film. It should also be recognized that in general, up to the outer 3 mils of a film can be involved in the sealing of the film to itself or another layer. In general, a sealant layer sealed by heat-sealing layer comprises any thermoplastic polymer. In some embodiments, the heat-sealing layer can comprise, for example, thermoplastic polyolefin, thermoplastic polyamide, thermoplastic polyester, and thermoplastic polyvinyl chloride. In some embodiments, the heat-sealing layer can comprise thermoplastic polyolefin.

As used herein, the term "skin layer" refers to an outer layer of a multilayer film used in a package containing a product, wherein the film is used to make the package so that the outer layer is an outside layer with respect to the package. Such outside outer film layers are subject to abuse during storage and handling of the packaged products.

The term "talc" as used herein refers to a composition consisting entirely or almost entirely of hydrated magnesium silicate. In some embodiments, talc can generally be described by either of the following formulas: $H_2Mg_3(SiO_3)_4$ or $Mg_3Si_4O_{10}(OH)_2$.

As used herein, the term "tie layer" refers to an internal film layer having the primary purpose of adhering two layers to one another. In some embodiments, tie layers can comprise any nonpolar polymer having a polar group grafted thereon, such that the polymer is capable of covalent bonding to polar polymers such as polyamide and ethylene/vinyl alcohol copolymer. In some embodiments, tie layers can comprise at least one member selected from the group including, but not limited to, modified polyolefin, modified ethylene/vinyl acetate copolymer, and/or homogeneous ethylene/alpha-olefin copolymer. In some embodiments, tie layers can comprise at least one member selected from the group consisting of anhydride modified grafted linear low density polyethylene, anhydride grafted low density polyethylene, homogeneous ethylene/alpha-olefin copolymer, and/or anhydride grafted ethylene/vinyl acetate copolymer.

The term "transparent" as used herein can refer to the ability of a film, layer, or coating to transmit incident light with negligible scattering and little absorption, enabling objects (e.g., packaged food or print) to be seen clearly through the material under typical unaided viewing conditions (i.e., the expected use conditions of the material). The transparency of the material can be at least about any of the following values: 20%, 25%, 30%, 40%, 50%, 65%, 70%, 75%, 80%, 85%, and 95%, as measured in accordance with ASTM D1746.

The term "very low density polyethylene" or "VLDPE" as used herein refers to resins that have densities ranging from about 880 to about 912 $kg/m^3$, and melt indices of from about 0.5 to about 5 g/10 minutes.

All compositional percentages used herein are presented on a "by weight" basis, unless designated otherwise.

Although the majority of the above definitions are substantially as understood by those of skill in the art, one or more of the above definitions can be defined hereinabove in a manner differing from the meaning as ordinarily understood by those of skill in the art, due to the particular description herein of the presently disclosed subject matter.

III. The Disclosed Film

III.A. Generally

The presently disclosed subject matter is directed generally to a polymeric film that comprises at least one marking layer such that the film is laser imageable. The marking layer comprises a polyolefin, a photochromatic pigment, and an additive. In some embodiments, the marking layer can be a skin layer.

The disclosed film can be monolayer or multilayer. To this end, the disclosed film can comprise from 1 to 20 layers; in some embodiments, from 2 to 12 layers; in some embodiments, from 2 to 9 layers; and in some embodiments, from 3 to 8 layers. Thus, in some embodiments, the disclosed film can have 1, 2, 3, 4, 5, 6, 7, 8, 9, 10, 11, 12, 13, 14, 15, 16, 17, 18, 19, or 20 layers. One of ordinary skill in the art would also recognize that the disclosed film can comprise more than 20 layers, such as in embodiments wherein the films comprise microlayering technology.

The disclosed film can have any total thickness as long as the film provides the desired properties for the particular packaging operation in which it is to be used. Nevertheless, in some embodiments the disclosed film can have a total thickness ranging from about 0.1 mil to about 15 mils; in some embodiments, from about 0.2 mil to about 10 mils; and in some embodiments, from about 0.3 mils to about 5.0 mils.

In some embodiments, at least a portion of the disclosed film can be irradiated to induce crosslinking. In the irradiation process, the film is subjected to one or more energetic radiation treatments, such as corona discharge, plasma, flame, ultraviolet, X-ray, gamma ray, beta ray, and high energy electron treatment, each of which induces cross-linking between molecules of the irradiated material. The irradiation of polymeric films is disclosed in U.S. Pat. No. 4,064,296, to Bornstein et al., which is hereby incorporated by reference in its entirety.

III.B. Marking Layer

As set forth above, the disclosed film includes at least one marking layer capable of being imaged when exposed to a laser. In some embodiments, the marking layer can be the skin layer of the film. Alternatively, in some embodiments, the marking layer can be an inner film layer. For example, in some embodiments, the marking layer can be an inner film layer and can be positioned adjacent to a transparent film layer or coating (such a layer comprising polypropylene, polyethylene, PET nylon, and the like). The marking layer comprises a polyolefin (such as high density polyethylene), a photochromatic pigment, and an additive.

III.B.i. Polyolefin

Any of a wide variety of polyolefins are suitable for use in the marking layer of the disclosed film. For example, the polyolefin can include (but is not limited to) polyethylene homopolymers and copolymers, polypropylene homopolymers and copolymers, polybutene homopolymers and copolymers, ethylene alpha-olefin copolymers, propylene alpha-olefin copolymers, butene alpha-olefin copolymers, ethylene unsaturated ester copolymers, ethylene unsaturated acid co polymers, (e.g., ethylene ethyl acrylate copolymer, ethylene butyl acrylate copolymer, ethylene methyl acrylate copolymer, ethylene acrylic acid copolymer, and ethylene methacrylic acid copolymer), ethylene vinyl acetate copolymers, ionomer resin, polymethylpentene, and the like. Thus, in some embodiments, the polyolefin can be polyethylene or polypropylene. Suitable types of polyethylene include (but are not limited to) low density polyethylene (LDPE), linear low density polyethylene (LLDPE), ultra low density polyethylene (ULDPE), very low density polyethylene (VLDPE), high density polyethylene (HDPE), and ultra-high molecular weight polyethylene (UHMWPE). In some embodiments, more than one polyolefin can be incorporated into the marking layer of the disclosed film.

The polyolefin component can be present in the marking layer in an amount of from about 40% to about 94%; in some embodiments, about 50% to about 84%; and in some embodiments, from about 60% to about 74%, based on the total weight of the layer. Thus, in some embodiments, the polyolefin can be present in the marking layer in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, or 94%, based on the total weight of the layer.

III.B.ii. Photochromatic Pigment

Suitable photochromatic pigments that can be incorporated into the marking layer include any pigment that can form an image when exposed to laser radiation. Thus, any of a wide variety of commercially available laser markable pigments can be used, such as (but not limited to) Datalase™ (available from Datalase, Ltd., Cheshire, United Kingdom); Digilase™ (available from Directed Energy, Inc., Fort Collins, Colo., United States of America); MARK-IT™ (available from Englehard Corp., Iselin, N.J., United States of America); PACKMARK™, CASEMARK™, GUARDMARK™, FOODMARK™, and PHARMAMARK™ (all available from Datalase, Ltd., Cheshire, United Kingdom); FAST-MARK™ (available from Polyone Corp., Avon Lake, Ohio, United States of America); CerMark™ (available from Cerdec Corp., Washington, Pa., United States of America); and Lazerflair™ (available from EMD Chemicals, Gibbstown, N.J., United States of America). For example, in some embodiments, the pigment can be Datalase Pigment A, which forms a monochrome grey/black marking when exposed to a $CO_2$ laser or to a UV laser. One of ordinary skill in the art would recognize that suitable pigments are not limited to those that produce grey/black images and can also include pigments that incorporate at least one color into the marking layer. One of ordinary skill in the art would also recognize that more than one pigment can be included within the marking layer of the disclosed film.

In some embodiments, the pigment can be a metal, molybdenum, titanium, zinc, a polydiacetylene-based compound, a diacetylene-based compound, ammoniumoctamolybdate (AOM), another molybdenum compound, a vanadium compound, a tungsten compound, a compound containing a transitional metal, or any other material that can allow, promote, provide, or have a composition adequate for changing of color in response to an energy source such as a laser.

The pigment is present in the marking layer in a range of about 2% to about 60%; in some embodiments, about 5% to about 45%; in some embodiments, about 7% to about 30%; and in some embodiments, about 10% to about 27%, based on the total weight of the layer. In some embodiments, the amount of pigment present in the marking layer is about 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60%, based on the total weight of the layer.

III.B.iii. Additive

As set forth above, the disclosed film includes a marking layer comprising an olefin, a pigment, and an additive. Without being bound by any particular theory, it is believed that the disclosed film does not exhibit any of the distortion issues common in the art when laser imaging a polyolefin film because the additive serves to efficiently diffuse the heat of reaction and provide heat resistance such that the polyolefin is not distorted.

Exemplary additives can include (but are not limited to) at least one of the following: talc, carbon black, graphite, zirconium silicates, calcium silicates, zeolite, cordierite, mica, kaolin, calcium carbonate and the like. For example, in some embodiments, the additive can be talc. The term "talc" is to be understood to mean naturally occurring or synthetically produced talc. Pure talc has the chemical composition $3MgO.4SiH_{(2)}.H_{(2)}O$ and consequently has an MgO content of 31.9 weight percent, an $SiO_2$ content of 63.4 weight percent and a content of chemically bound water of 4.8 weight percent. Naturally occurring talc materials generally do not have the ideal composition specified, since they are contaminated as a result of partial replacement of the magnesium by other elements, by partial replacement of silicon, and/or as a result of intergrowths with other minerals.

In some embodiments, additive can be present in the marking layer in an amount of about 30% to about 60%; in some embodiments, from about 35% to about 55%; and in some embodiments, from about 40% to about 50%, based on the total weight of the layer. Thus, in some embodiments, the additive can be present in the marking layer in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 weight percent, based on the total weight of the layer.

III.C. Additional Layers

In addition the marking layer discussed herein above, the disclosed film can comprise one or more barrier layers, seal layers, tie layers, abuse layers, and/or bulk layers.

The polymer components used to fabricate the disclosed film can also comprise appropriate amounts of other additives normally included in such compositions. For example, slip agents, antioxidants, fillers, dyes, pigments and dyes, radiation stabilizers, antistatic agents, elastomers, and the like can be added to the disclosed films. See, for example, U.S. Pat. No. 7,205,040 to Peiffer at al.; U.S. Pat. No. 7,160,378 to Eadie et al.; U.S. Pat. No. 7,160,604 to Ginossatis; U.S. Pat. No. 6,472,081 to Tsai et al.; U.S. Pat. No. 6,222,261 to Horn at al.; U.S. Pat. No. 6,221,470 to Ciacca at al.; U.S. Pat. No. 5,591,520 to Migliorini et al.; and U.S. Pat. No. 5,061,534 to Blemberg at al., the disclosures of which are hereby incorporated by reference in their entireties.

IV. Methods of Making the Disclosed Film

The presently disclosed film can be constructed by any suitable process known to those of ordinary skill in the art, including (but not limited to) coextrusion, lamination, extrusion coating, and combinations thereof. See, for example, U.S. Pat. No. 6,769,227 to Mumpower, the content of which is herein incorporated by reference in its entirety.

The pigment and additive components of the marking layer can be mixed together in any conventional manner. For example, in some embodiments, the pigment and additive can be mixed with the polymer components of the marking layer by tumble or dry blending or by compounding in an extruder, followed by cooling. Masterbatching technology can also be employed. The pigment and the additive can be added to the polymer components of the marking layer individually, simultaneously or in succession, or as a mixture.

V. Methods of Using the Disclosed Film

As set forth in detail herein above, the presently disclosed subject matter is directed to a polymeric film that includes a marking layer comprising a polyolefin, a photochromatic pigment, and an additive. While it has proven difficult in the prior art to laser image polyolefin films, the disclosed film comprises a polychromatic pigment and an additive, which are believed to facilitate laser imaging. In laser marking, radiation is directed onto the marking layer of a substrate film to modify the film in a way that induces a change that can be detected optically. Specifically, in some embodiments, the film is introduced into the beam path of a laser. The disclosed film is responsive to exposure to a laser beam by undergoing an irreversible color change. In some embodiments, the laser can be controllable by a computer that is programmed to project the laser beam in a predetermined pattern.

The laser can be a $CO_2$ laser, an Nd-YAG laser, and/or an excimer laser. However, the laser used is not limited and the disclosed film can be imaged using any of a wide variety of lasers known in the art, so long as the laser has a wavelength in the absorption range of the pigment used. The shade and depth of color obtained are determined by the laser parameters, such as irradiation time and output, as would be known to those of ordinary skill in the relevant art. For example, low energy densities lead to light markings in the film, while high energy densities lead to dark markings. The output of lasers used depends on the particular application and can readily be determined by the skilled worker in each individual case. For example, in some embodiments, the disclosed film can be marked by a laser in a wavelength range from about 300 to 10,000 nm. Thus, the disclosed film can be marked by a laser in a wavelength range of about 300, 350, 400, 450, 500, 550, 600, 650, 700, 750, 800, 850, 900, 1000, 1250, 1500, 1750, 2000, 2250, 2500, 2750, 3000, 3250, 3500, 3750, 4000, 4250, 4500, 4750, 5000, 5250, 5500, 5750, 6000, 6250, 6500, 6750, 7000, 7250, 7500, 7750, 8000, 8250, 8500, 8750, 9000, 9250, 9500, 9750, or 10,000 nm.

One example of a suitable laser is a Videojet 3320 laser marking system commercially available from Videojet Technologies of Wood Dale, Ill., United States of America. The laser marking system includes a sealed-off $CO_2$ laser rated at an output of 30 Watts and a 10.6 μm wavelength with a SHC 60 focusing lens. It should be noted that according to other exemplary embodiments, other types of $CO_2$ lasers, fiber lasers, laser diodes, laser diode arrays, UV lasers, near infrared diode lasers, YAG lasers, arrays of other lasers (e.g., $CO_2$ lasers) or other lasers with sufficient power and fluence to change the color of a coating can be used. For example, in some embodiments, the energy source can be configured to change the color of the pigment by changing an oxidization state of the pigment, by polymerizing the pigment, by breaking an encapsulant to release a dye in the pigment, and/or by changing a phase of the pigment.

The radiation can be directed in a pattern over the substrate film such that a desired indicia or image is rendered. Particularly, variable and/or fixed data (i.e., text and/or graphics) can be printed. In addition, the image can be printed in color or monochrome (e.g., black). The image can include variable data, which can comprise geographic, demographic, postal, personal, and/or book data, or any combination of these types of information and other types of information not specifically identified here. In addition, the variable data can comprise bar codes representing certain data or other information, such as address data, universal product code (UPC) data, price data, or other data.

The disclosed film can be used in all sectors where customary printing processes have hitherto been employed for the imaging of plastics. For example, in embodiments where the substrate is used as a packaging film, the packaging can be any material used to pack or label a product, such as a lidding film for a food or medical package. In some embodiments, the lidding film can be peelable. Thus, the disclosed film can be converted into a package according to standard methods known in the art. See, for example, U.S. Pat. Nos. 6,686,006; 6,250,048; 4,751,808; 4,727,707, and U.S. Patent Application Publication No. 2007/0167123, the entire disclosures of which are incorporated by reference herein.

The marking of the disclosed film is characterized by a very high quality of imaging with minimal film distortion. In some embodiments, the optical density of the disclosed film can be from about 0.5 to about 1.25; in some embodiments, from about 0.6 to about 1.15; in some embodiments, from about 0.7 to about 1.0; and in some embodiments, about 0.65 to about 0.90, based on a 0.0 (white) to 1.25 (black) ODB scale. Thus, in some embodiments, the disclosed film can have an optical density of about 0.500, 0.525, 0.550, 0.575, 0.600, 0.625, 0.650, 0.675, 0.700, 0.725, 0.750, 0.800, 0.825, 0.850, 0.875, 0.900, 0.925, 0.950, 0.975, 1.00, 1.025, 1.050, 1.075, 1.100, 1.125, 1.150, 1.175, 1.200, 1.225, or 1.250.

The text is clearly legible and is distinguished by a high degree of resolution. Overall, the marking is of pleasing appearance and is capable of matching a packaging design well. Because laser imaging is performed using non-contact methods with a relatively large distance between the laser and the film, packages that are already filled and sealed can be marked without any problems. Moreover, the integration of a marking unit within a packaging plant has the advantage that the production process can be substantially more flexible. In addition, it has been shown that after sterilization the marking remains clearly legible and is not subject to changes.

Although the disclosed films can be sealed to themselves to form a sealed package (for example, as in the VFFS or HFFS packaging methods known in the art), in some embodiments, the disclosed films can be sealed to a substrate in one or more selected areas (e.g., perimeter) to form a sealed package. In some embodiments, the substrate can be flexible or rigid. In some embodiments, the substrate can be a monolayer substrate film or a multilayer substrate film, such as those thermoplastic films used as the formed web (e.g., "bottom" web) of the thermoforming or vacuum skin packaging methods known in the art. In some embodiments, the substrate can include a flexible or rigid metal (e.g., aluminum foil) or cellulosic (e.g., paper) flexible substrate.

In some embodiments, the substrate can comprise a monolayered or multilayered rigid support, such as a plastic or corrugated backing board having a surface film layer, coating or other modification to facilitate sealing to the film, or rigid tray having perimeter flange with a similar film layer, coating or modification at least in the flange area to facilitate sealing to the film. The rigid trays or supports can be formed from thermoset plastics, thermoplastics (e.g., expanded polystyrene sheet material which has been thermoformed into a desired shape), cellular or foamed plastics (e.g., extruded polystyrene foam sheet), metal, and/or combinations thereof.

VI. Advantages of the Disclosed Film

The presently disclosed subject matter provides for laser imaging of polymeric films comprising olefin components. As a result, the disclosed film and methods can replace conventional inkjet, digital, web-based or gravure-based printing processes.

The disclosed methods therefore reduce printing time, improve efficiency, reduce the costs associated with inks, and provide greater flexibility compared to prior art imaging methods. In addition, the disclosed method does not require formulating, cleaning, and provides for reduced scrap with no changeover required. Further, transitions between films are automatic and the lasers are capable of changing images instantly.

The disclosed film and methods are also more sustainable compared to prior art marking methods. Specifically, the use of printing solvents as well as related VOC (volatile organic compounds) is eliminated using the disclosed methods.

Further, customers using the disclosed system and methods can customize packaging for specific lot traceability as required for many pharmaceutical products that require every unit to be controlled and traceable. Prior art methods require the use of expensive pressure-sensitive labels for each package.

The addition of the additives disclosed herein (such as talc) facilitates a marketable image on the film by eliminating film distortion that might otherwise occur with the use of marking lasers.

In addition, laser marked articles can be safely employed in packaging for foodstuffs, medical uses, and the like. These markings on packaging are wipe-resistant, scratch-resistant, stable during subsequent sterilization processes, and applied in a hygienically pure manner during the marking process.

EXAMPLES

The following Examples provide illustrative embodiments. In light of the present disclosure and the general level of skill in the art, those of ordinary skill in the art will appreciate that the following Examples are intended to be exemplary only and that numerous changes, modifications, and alterations can be employed without departing from the scope of the presently disclosed subject matter.

Several film structures in accordance with the presently disclosed subject matter and comparatives are identified herein below in Tables 1 and 2.

TABLE 1

Resin Identification

| Material Code | Trade Name or Designation | Source |
|---|---|---|
| A | Alathon L5885 | LyondellBasell Industries (Rotterdam, Netherlands) |
| B | 110313-B | Ampacet (Tarrytown, New York, United States of America) |
| C | EXCEED ® 1012CA | ExxonMobile (Fairfax, Virginia, United States of America) |
| D | Datalase Pigment A | Datalase, Ltd. (Widnes, United Kingdom) |
| E | 100622 | Ampacet (Tarrytown, New York, United States of America) |
| F | ABC-5000PB | Polyfil Corporation (Rockaway, New Jersey, United States of America) |
| G | Petrothene NA 345-013 | LyondellBasell Industries (Rotterdam, Netherlands) |
| H | Polybutene-1 PB 8640M | LyondellBasell Industries (Rotterdam, Netherlands) |
| I | Alathon L5045 | LyondellBasell Industries (Rotterdam, Netherlands) |
| J | 11853 | Ampacet (Tarrytown, New York, United States of America) |
| K | SURPASS ® HPs167-AB | Nova Chemicals (Moon Township, Pennsylvania, United States of America) |
| M | PHC-0001HD | Polyfil Corporation (Rockaway, New Jersey, United States of America) |
| N | PAC-0154LL | Polyfil Corporation (Rockaway, New Jersey, United States of America) |
| O | Alathon L6012 | LyondellBasell Industries (Rotterdam, Netherlands) |
| P | Kemamide W-40 Prill | PMC Biogenix, Inc. (Mt. Laurel, New Jersey, United States of America) |

A is a high density polyethylene with melt index of 0.85 and density of 0.958 g/cc.

B is white color concentrate in low density polyethylene with specific gravity of 2.02 and melt index of 2-6 (ASTM D1238, 190/2.16).

C is very low density ethylene/hexene copolymer with density of 0.912-0.913 g/cc.

D is a photochromatic pigment with melting point of 200° C. and 0.5 micron particle size.

E is antiblock and slip in low density polyethylene.

F is talc in low density polyethylene.

G is low density polyethylene homopolymer with flow rate of 1.8 g/10 minutes, density of 0.921 g/cc, and melting point of 112° C.

H is butene/ethylene copolymer with density of 0.908 g/cc, melting point of 116° C., and melt flow rate of 1.0 g/10 minutes.

I is a high density polyethylene with melt index of 0.45 and density of 0.950 g/cc.

J is white color concentrate in linear low density polyethylene with specific gravity of 1.513 g/cc and melt index of 2.9 g/10 minutes (+/−1.0).

K is high density polyethylene.

M is nucleating agent.

N is linear low density polyethylene (PA) with melt index of melt flow rate of 2.0 g/10 minutes and density of 0.920 g/cc.

O is high density polyethylene with melt index 12.0 and density of 0.960 g/cc.

P is an amide wax with DSC melting point of 146° C. (+/−3° C.), specific gravity of 0.995, and capillary melting point range of 140-146° C.

TABLE 2

| Film Identification | | | | |
|---|---|---|---|---|
| Film ID | Layer | Formulation | Volume % | Mils |
| Film 1 | 1 | 62% A | 90.0 | 3.15 |
| | | 10% B | | |
| | | 28% C | | |
| | 2 | 88% A | 10.0 | 0.35 |
| | | 10% D* | | |
| | | 2% E | | |
| Film 2 | 1 | 62% A | 90.0 | 3.15 |
| | | 10% B | | |
| | | 28% C | | |
| | 2 | 78% A | 10.0 | 0.35 |
| | | 20% D* | | |
| | | 2% E | | |
| Film 3 | 1 | 62% A | 90.0 | 3.15 |
| | | 10% B | | |
| | | 28% C | | |
| | 2 | 68% A | 10.0 | 0.35 |
| | | 30% D* | | |
| | | 2% E | | |
| Film 4 | 1 | 62% A | 90.0 | 3.15 |
| | | 10% B | | |
| | | 28% C | | |
| | 2 | 58% A | 10.0 | 0.35 |
| | | 40% D* | | |
| | | 2% E | | |
| Film 5 | 1 | 62% A | 90.0 | 3.15 |
| | | 10% B | | |
| | | 28% C | | |
| | 2 | 48% A | 10.0 | 0.35 |
| | | 50% D* | | |
| | | 2% E | | |
| Film 6 | 1 | 62% A | 90.0 | 3.15 |
| | | 10% B | | |
| | | 28% C | | |
| | 2 | 38% A | 10.0 | 0.35 |
| | | 20% D* | | |
| | | 2% E | | |
| | | 40% F | | |
| Film 7 | 1 | 62% A | 90.0 | 3.15 |
| | | 10% B | | |
| | | 28% C | | |
| | 2 | 28% A | 10.0 | 0.35 |
| | | 30% D* | | |
| | | 2% E | | |
| | | 40% F | | |
| Film 8 | 1 | 62% A | 90.0 | 3.15 |
| | | 10% B | | |
| | | 28% C | | |
| | 2 | 18% A | 10.0 | 0.35 |
| | | 40% D* | | |
| | | 2% E | | |
| | | 40% F | | |
| Film 9 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 40% F | 10.0 | 0.35 |
| | | 35% D* | | |
| | | 19.5% K | | |
| | | 3% M | | |
| | | 1.5% E | | |
| | | 1% N | | |
| Film 10 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 45% F | 10.0 | 0.35 |
| | | 35% D* | | |
| | | 14.5% K | | |
| | | 3% M | | |
| | | 1.5% E | | |
| | | 1% N | | |
| Film 11 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 50% F | 10.0 | 0.35 |
| | | 35% D* | | |
| | | 9.5% K | | |
| | | 3% M | | |
| | | 1.5% E | | |
| | | 1% N | | |
| Film 12 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 40% F | 10.0 | 0.35 |
| | | 40% D* | | |
| | | 14.5% K | | |
| | | 3% M | | |
| | | 1.5% E | | |
| | | 1% N | | |
| Film 13 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 45% F | 10.0 | 0.35 |
| | | 40% D* | | |
| | | 9.5% K | | |
| | | 3% M | | |
| | | 1.5% E | | |
| | | 1% N | | |
| Film 14 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 50% F | 10.0 | 0.35 |
| | | 40% D* | | |
| | | 4.5% K | | |
| | | 3% M | | |
| | | 1.5% E | | |
| | | 1% N | | |
| Film 15 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 40% D* | 10.0 | 0.35 |
| | | 54.5% K | | |
| | | 3% M | | |
| | | 1.5% E | | |
| | | 1% N | | |
| Film 16 | 1 | 57% G | 25.0 | 0.87 |
| | | 20% H | | |
| | | 23% C | | |

TABLE 2-continued

| Film Identification | | | | |
|---|---|---|---|---|
| Film ID | Layer | Formulation | Volume % | Mils |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 40% F | 10.0 | 0.35 |
| | | 40% D* | | |
| | | 17.5% K | | |
| | | 1.5% E | | |
| | | 1% N | | |
| Film 17 | 1 | 57% G | 25.0 | 0.87 |
| | | 20% H | | |
| | | 23% C | | |
| | 2 | 48% C | 45.3 | 1.59 |
| | | 40% I | | |
| | | 12% K | | |
| | 3 | 88% K | 19.7 | 0.69 |
| | | 12% J | | |
| | 4 | 40% D* | 10.0 | 0.35 |
| | | 57.5% K | | |
| | | 1.5% E | | |
| | | 1% N | | |

*A masterbatch of component D was used to prepare Films 1-17.

Example 1

Preparation of Pigment Masterbatch

A pigment masterbatch was prepared according to the formulation: 64% O, 35% D, and 1% P (from Table 1). The mixture was compounded on a WP twin screw extruder with a temperature profile of 380-330-330-330 and an output of 100 g/minute. The 35% pigment masterbatch was then incorporated into Films 1-17 as set forth in Table 2.

Example 2

Preparation of Films 1-8

Films 1-8, with the compositions and constructions shown in Table 2, were prepared on a conventional blown film line.

Example 3

Imaging of Films 1-8

1 cm×1 cm square samples of Films 1-8 were prepared. Each sample was imaged using a Videojet 3320 laser (available from Videojet Technologies Inc., Wood Dale, Ill., United States of America) with a 127 mm lens to produce square block images. The Videojet 3320 features a single sealed 30 watt $CO_2$ laser in which beam deflection is controlled by digital high-speed galvanometer scanners. Such lasers generate high power light via excitation of the $CO_2$ within a sealed chamber. The light is focused to a small, intense beam that is used for writing or marking. The whole process, from excitation to writing or marking, is controlled by computer software supplied with the laser system.

Observations of the imaged films are given below in Table 3. An observation of "best" refers to a film with minimal film distortion and very dark, readable images. An observation of "good" refers to a film with slight to minimal distortion and dark, readable images. An observation of "fair" refers to a film with slight film distortion and light images. An observation of "poor" refers to a film with some film distortion and very faint images.

TABLE 3

| Observations of Imaged Films 1-8 | | | | |
|---|---|---|---|---|
| Film | Poor | Fair | Good | Best |
| 1 | x | | | |
| 2 | | x | | |
| 3 | | x | | |
| 4 | | x | | |
| 5 | | | x | |
| 6 | | x | | |
| 7 | | | x | |
| 8 | | | | x |

After imaging, it was observed that Films 4 and 5 with 40% and 50% pigment and no filler were legible. It was also observed that Films 7 and 8 with 30% and 40% pigment and filler were legible. Thus, it was observed that films with 40% pigment and filler had equivalent legibility to the film sample with 50% pigment and no filler. Without being bound by any particular theory, it appears that the filler reduces the film distortion due to the heat from the chemical reaction of the pigment. It was also noted that a small amount of heat distortion was present in the most legible film samples.

Example 4

Preparation of Films 9-17

Films 9-17 were constructed using the method set forth above in Example 1.

Example 5

Optical Density Testing of Films 9-17—First Trial

Label-sized samples of Films 9-17 were prepared. Each sample was imaged using a Videojet 3320 laser with a 190 mm lens to produce square block images. The file design used for each trial was "Square Blocks" with the following parameters: filling size/line width of 0.187 mm, power (%) of 40, 45, 50, 55, 60, 65, 70, 75, and marking speed ($mms^{-1}$) of 2000.

In addition to the square blocks, the Videojet 3320 laser was used to image text and single line graphics, a 2D datamatrix code, and an EAN-13 barcode onto each label. The parameters for the imaging of the graphics and codes are set forth in Table 4 below.

TABLE 4

| Graphics and Code Parameters | | | |
|---|---|---|---|
| Label Element | Text and Single Line Graphics | 2D Datamatrix Code | EAN-13 Barcode |
| Filling Size/Line Width (mm) | n/a | 0.2 | 0.187 |
| Power (%) | 72 | 55 | 67 |
| Marking Speed ($mms^{-1}$) | 2000 | 2000 | 2000 |

After the labels were imaged, the 2D Datamatrix Code was read with a Pepperl+Fuchs Omnitron reader (available from Pepperl+Fuchs, GMBH, Mannheim, Germany) and the EAN-13 barcode was verified with a REA Scancheck II (available from REA Elektronik, GMBH, Muehltal, Germany).

To minimize any distortion or deformation, the film samples were held in position with 4 standard plastic springloaded clamps at each corner of the sample. As a result, each sample was under slight tension when heated by the laser imaging process and was thereby representative of a sealed package with the film adhered as the backing of the package.

To minimize any smoke smearing during laser image testing, a standard desktop office fan was used to blow air up and away from each sample towards a fume extractor fitted with a wide collection nozzle. Thus, the airflow was not across the film material surface when heated by the laser imaging process. This process was believed to be representative of a positive air feed from a compressor or a small industrial fan unit applied in combination with a standard fume extractor.

The black optical density (ODB) value for each sample was measured with a SpectroEye spectrophotometer (available from X-Rite, Inc. of Grand Rapids, Mich., United States of America). The ODB value for each sample is given below in Table 5.

TABLE 5

Optical Density Values for Films 9-17 - First Trial

| Film No. | ODB |
|---|---|
| 9 | 0.65 |
| 10 | 0.79 |
| 11 | 0.78 |
| 12 | 0.83 |
| 13 | 0.88 |
| 14 | 0.85 |
| 15 | 0.85 |
| 16 | 0.88 |
| 17 | 0.81 |

Example 6

Optical Density Testing of Films 9-17—Second Trial

Label-sized samples of Films 9-17 were prepared as set forth in Example 5 above. The labels were imaged using a Videojet 3320 laser with a 127 mm lens to produce a label with square blocks, text and single line graphics, a 2D datamatrix code, and an EAN-13 barcode. It should be noted that in the second trial, the laser conditions were optimized. All other conditions were repeated as in Example 5.

The black optical density (ODB) value for each sample was measured with a SpectroEye spectrophotometer as in Example 5. The ODB value for each sample from Trial 2 is given below in Table 6, with 0.0=white and 1.25=black.

TABLE 6

Optical Density Values for Films 9-17 - Second Trial

| Film No. | ODB |
|---|---|
| 9 | 0.59 |
| 10 | 0.75 |
| 11 | 0.69 |
| 12 | 0.75 |
| 13 | 0.84 |
| 14 | 0.72 |
| 15 | 0.78 |
| 16 | 0.82 |
| 17 | 0.78 |

From the data, it appears that film samples with 40% versus 35% pigment concentration achieved an increase in average ODB of 0.10 (about 15%), i.e., from 0.68 to 0.78. It was also demonstrated that for a particular film type, 35% pigment can achieve the ODB of a 40% pigment film. Particularly, Film 10 (with a 35% pigment concentration) had an ODB of 0.75, Film 12 (with a 40% pigment concentration) had an ODB of 0.75, and Film 14 (with a pigment concentration of 40%) had an ODB of 0.72. For this range of film types, a material with a 35% pigment concentration achieves an ODB of 0.59 to 0.75, whereas a film with a 40% pigment concentration achieves an ODB of 0.72 to 0.84.

What is claimed is:

1. A polymeric film comprising an extruded marking layer comprising a blend of:

a. a polyolefin;

b. a photochromatic pigment that forms an image after exposure to laser radiation, wherein said pigment is present in the layer in an amount of from about 11 to 60 weight percent, based on the total weight of the layer; and c. a heat diffusing additive present in the layer in an amount of from about 30 to 60 weight percent, based on the total weight of the layer;

wherein said film can be marked by a laser in a wavelength range from about 300 to 10,000 nm.

2. The film of claim 1, wherein said polyolefin is high density polyethylene.

3. The film of claim 1, wherein said additive is selected from the group comprising at least one of the following: talc, carbon black, graphite, zirconium silicates, calcium silicates, zeolite, cordierite, mica, kaolin.

4. The film of claim 3, wherein said additive is talc.

5. The film of claim 1, wherein the additive is present in the marking layer in an amount of about 30% to about 50%, based on the total weight of the layer.

6. The film of claim 1, wherein the pigment is present in the marking layer in an amount of about 25% to about 55%, based on the total weight of the layer.

7. The film of claim 1, further comprising a transparent layer or coating positioned adjacent to or directly adjacent to said marking layer.

8. The film of claim 1, wherein said film is a laminate comprising a transparent film layer.

9. A package comprising the film of claim 1.

10. A method of laser marking a polymeric film, said method comprising:

a. providing a polymeric film comprising an extruded marking layer comprising:

i. a polyolefin;

ii. a photochromatic pigment that forms an image after exposure to laser radiation, wherein said pigment is present in the layer in an amount of from about 11 to 60 weight percent, based on the total weight of the layer; and iii. a heat diffusing additive present in the layer in an amount of from about 30 to 60 weight percent, based on the total weight of the layer, and b. exposing said film to a laser to produce an image on the film.

11. The method of claim 10, wherein said image is black.

12. The method of claim 10, wherein said image is single-colored or multi-colored.

13. The film of claim 1, wherein said marking layer is the skin layer of said film.

14. The method of claim 10, wherein said marking layer is the skin layer of said film.

15. The film of claim 1, wherein said polyolefin is present within the marking layer in an amount of from about 40 to 90 weight percent, based on the total weight of the layer.

16. The method of claim 10, wherein said polyolefin is present within the marking layer in an amount of from about 40 to 90 weight percent, based on the total weight of the layer.

17. The film of claim 1, wherein said pigment is selected from the group consisting of: metal, molybdenum, titanium, zinc, polydiacetylene-based compound, diacetylene-based compound, ammoniumoctamolybdate (AOM), vanadium compound, tungsten compound, compound containing a transitional metal, or combinations thereof.

18. The method of claim 10, wherein said pigment is selected from the group consisting of: metal, molybdenum, titanium, zinc, polydiacetyiene-based compound, diacetylene-based compound, ammoniumoctamolybdate (AOM), vanadium compound, tungsten compound, compound containing a transitional metal, or combinations thereof.

19. The film of claim 1, further comprising at least one barrier, seal, tie, abuse, or bulk layer.

20. The method of claim 10, wherein said film further comprises at least one barrier, seal, tie, abuse, or bulk layer.

21. The film of claim 1, wherein said film has an optical density of 0.5 to 1.25, based on a 0.0 (white) to 1.25 (black) ODB scale.

22. The method of claim 1, wherein said film has an optical density of 0.5 to 1.25, based on a 0.0 (white) to 1.25 (black) scale.

* * * * *